US012420459B2

(12) United States Patent
Yamamoto et al.

(10) Patent No.: US 12,420,459 B2
(45) Date of Patent: Sep. 23, 2025

(54) LAMINATE MOLDING SYSTEM, METHOD FOR CONTROLLING LAMINATE MOLDING SYSTEM, AND METHOD FOR MANUFACTURING LAMINATE MOLDED ARTICLE

(71) Applicant: THE JAPAN STEEL WORKS, LTD., Tokyo (JP)

(72) Inventors: Takayuki Yamamoto, Tokyo (JP); Keiichirou Sugisaki, Tokyo (JP); Kenji Fukumoto, Tokyo (JP); Naoki Ueda, Tokyo (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 327 days.

(21) Appl. No.: 17/939,441

(22) Filed: Sep. 7, 2022

(65) Prior Publication Data

US 2023/0330898 A1    Oct. 19, 2023

(30) Foreign Application Priority Data

Apr. 19, 2022 (JP) ................. 2022-068932

(51) Int. Cl.
*B29C 43/20* (2006.01)
*B29C 43/14* (2006.01)
(Continued)

(52) U.S. Cl.
CPC .......... *B29C 43/203* (2013.01); *B29C 43/146* (2013.01); *B29C 43/18* (2013.01);
(Continued)

(58) Field of Classification Search
CPC . B32B 37/10; B32B 37/1009; B32B 37/1018; B32B 37/1027; B32B 37/1054;
(Continued)

(56) References Cited

U.S. PATENT DOCUMENTS

| | | | |
|---|---|---|---|
| 5,700,562 A | 12/1997 | Sugimoto et al. | |
| 6,213,183 B1 * | 4/2001 | Kerr | B32B 37/18 100/154 |

(Continued)

FOREIGN PATENT DOCUMENTS

| | | |
|---|---|---|
| CN | 1106787 C | 4/2003 |
| CN | 101896325 A | 11/2010 |

(Continued)

OTHER PUBLICATIONS

Office Action, stylized "Notification of Examination Opinion," dated Feb. 15, 2023 in corresponding Taiwan Patent Application 111132854, with English Translation.

(Continued)

*Primary Examiner* — Jeffrey M Wollschlager
(74) *Attorney, Agent, or Firm* — Renner, Otto, Boisselle & Sklar, LLP

(57) ABSTRACT

A laminate molding system in which three or more press devices are continuously provided and a laminate molded article is sequentially pressure-molded. The laminate molding system includes first, second and third press devices. The first press device includes a pressure reducable chamber and a pressurizing surface formed of an elastic body sheet or a pressurizing surface formed of an elastic body sheet, the laminate molded article being pressurized by a driving force of a servomotor. The second press device includes a pressurizing surface formed of a metal press plate, the laminate molded article being pressurized by a driving force of a servomotor. The third press device includes a pressurizing surface formed of a metal press plate, the laminate molded article being pressurized by a driving force of a servomotor.

7 Claims, 4 Drawing Sheets

(51) Int. Cl.

| | |
|---|---|
| *B29C 43/18* | (2006.01) |
| *B29C 43/34* | (2006.01) |
| *B29C 43/56* | (2006.01) |
| *B29C 43/58* | (2006.01) |
| *B29L 9/00* | (2006.01) |
| *B29L 31/34* | (2006.01) |
| *B30B 15/30* | (2006.01) |
| *B32B 37/00* | (2006.01) |
| *B32B 37/10* | (2006.01) |
| *B32B 41/00* | (2006.01) |
| *H05K 3/00* | (2006.01) |

(52) U.S. Cl.
CPC .............. *B29C 43/34* (2013.01); *B29C 43/56* (2013.01); *B29C 43/58* (2013.01); *H05K 3/0014* (2013.01); *B29C 2043/563* (2013.01); *B29C 2043/5808* (2013.01); *B29K 2905/00* (2013.01); *B29K 2995/0007* (2013.01); *B29K 2995/0046* (2013.01); *B29L 2009/00* (2013.01); *B29L 2031/34* (2013.01); *B30B 15/306* (2013.01); *B32B 37/0046* (2013.01); *B32B 37/10* (2013.01); *B32B 41/00* (2013.01)

(58) Field of Classification Search
CPC ..... B32B 37/0046; B32B 41/00; B29C 43/56; B29C 2043/561; B29C 43/228; B29C 43/26; B29C 43/265; B29C 43/44; B29C 43/48; B29C 2043/483; B29C 43/58; B29C 2043/5825; B29C 43/54; B29C 43/203; B29C 43/146; B29C 43/18; B29C 43/34; B29C 2043/563; B29C 2043/5808; B29C 2043/3483; B29C 2043/147; B29C 2043/148; B29C 2043/189; B29C 43/02; B29C 43/32; B29C 43/206; H05K 3/0014; B29K 2905/00; B29K 2995/0007; B29K 2995/0046; B29L 2009/00; B29L 2031/34; B29L 2031/3425; B30B 15/306; B30B 15/308; B30B 15/34

See application file for complete search history.

(56) References Cited

U.S. PATENT DOCUMENTS

| | | | |
|---|---|---|---|
| 11,325,365 B1 * | 5/2022 | Iwata | ...................... B32B 37/28 |
| 2015/0314580 A1 * | 11/2015 | Sato | ...................... B32B 25/04 |
| | | | 156/312 |
| 2018/0162111 A1 * | 6/2018 | Iwata | ................... H05K 3/4655 |
| 2021/0370656 A1 * | 12/2021 | Iwata | ................... B30B 15/062 |
| 2022/0250288 A1 * | 8/2022 | Winterowd | ............. B29C 43/52 |

FOREIGN PATENT DOCUMENTS

| | | |
|---|---|---|
| CN | 107614232 A | 1/2018 |
| JP | 2002120100 A | 4/2002 |
| JP | 2014076548 A | 5/2014 |
| JP | 2020028980 A | 2/2020 |
| JP | 6900138 B1 | 7/2021 |
| JP | 2021100802 A | 7/2021 |
| JP | 2022015589 A | 1/2022 |
| JP | 7025499 B1 | 2/2022 |
| JP | 2022-050807 A | 3/2022 |
| TW | 201725951 A | 7/2017 |

OTHER PUBLICATIONS

Chinese Office Action dated Jul. 22, 2024 in corresponding Chinese Patent Application No. 202211105210.8, with English Translation of relevant part.
Decision to Grant dated Apr. 19, 2022, in corresponding Japanese application (OEE application) No. JP2022-068932, and English translation.
Notice of Reasons for Refusal in corresponding Japanese Patent Application No. 2022-068932 dated May 24, 2022 with English translation.
Written Amendment in corresponding Japanese Patent Application No. 2022-068932 dated Jun. 6, 2022 with English translation.
Written Opinion in corresponding Japanese Patent Application No. 2022-068932 dated Jun. 6, 2022 with English translation.
Chinese Office Action dated Dec. 14, 2023 in corresponding Chinese Patent Application No. 202211105210.8, with English Translation.
Extended European Search Report dated May 12, 2023 in corresponding European Patent Application 22194222.0.

* cited by examiner

LAMINATE MOLDING SYSTEM, METHOD FOR CONTROLLING LAMINATE MOLDING SYSTEM, AND METHOD FOR MANUFACTURING LAMINATE MOLDED ARTICLE

This application claims priority to Japanese Patent Application No. 2022-68932 filed Apr. 19, 2022, in the Japan Patent Office, which is hereby incorporated herein by reference.

BACKGROUND OF THE INVENTION

(1) Field of the Invention

The present invention relates to a laminate molding system in which at least three or more press devices are continuously provided and laminate molded articles are sequentially pressure-molded, a method for controlling the laminate molding system, and a method for manufacturing a laminate molded article.

(2) Description of Related Art

As a laminate molding system in which at least three or more press devices are continuously provided and laminate molded articles are sequentially pressure-molded, those described in JP 2002-120100 A and JP 2020-28980 A are known. JP 2002-120100 A describes that the laminate molding device includes a first flattening press machine 2 and a second flattening press machine 3 after a vacuum laminator 1. In addition, JP 2020-28980 A describes that the laminating device includes a vacuum laminating device 1, a first planar press means 2, and a second planar press means 3. Furthermore, it is described that the second planar press means 2 is configured such that at least one of a pair of plates is movable forward and backward toward the other plate by the operation of the servomotor.

However, the flattening press of the laminate molding device of JP 2002-120100 only describes using a hydraulic cylinder. On the other hand, in the laminating device of JP 2020-28980 A, the vacuum laminating device and the first planar press means perform control by hydraulic pressure. Therefore, J P 2002-120100 A and JP 2020-28980 A have a problem that it is difficult to perform accurate pressure control or force control in the first vacuum laminating device. Furthermore, since the first flattening press machine 2 and the first planar press means 2 provided in the post-process of the vacuum laminating device are also operated by the hydraulic cylinder, it is difficult to perform accurate pressure control or force control, and it is also difficult to perform accurate position control or the like when performing position control including speed control.

As a result, it was difficult to control the degree of state in which the laminate molded article is molded at each stage up to the second flattening press machine 3 and the second planar press means 3. When excessive pressurization or the like occurs in a certain press device, the quality such as the plate thickness of the final laminate molded article may not be stabilized. Therefore, an object of the present invention is to provide a laminate molding system that can satisfactorily perform laminate molding of a laminate molded article, a method for controlling the laminate molding system, and a method for manufacturing a laminate molded article. Other problems and novel features will become apparent from the description of the present specification and the accompanying drawings.

SUMMARY OF THE INVENTION

A laminate molding system of the present invention is a laminate molding system in which at least three or more press devices are continuously provided and a laminate molded article is sequentially pressure-molded, the laminate molding system including: a first press device having a pressure reducable chamber and a pressurizing surface formed of an elastic body sheet, the laminate molded article being pressurized by a driving force of a servomotor; a second press device having a pressurizing surface formed of a metal press plate or a pressurizing surface formed of an elastic body sheet, the laminate molded article being pressurized by a driving force of a servomotor; and a third press device having a pressurizing surface formed of a metal press plate, the laminate molded article being pressurized by a driving force of a servomotor, which are continuously provided.

According to one embodiment, it is possible to provide a laminate molding system capable of satisfactorily performing laminate molding of a laminate molded article, a method for controlling the laminate molding system, and a method for manufacturing the laminate molded article.

DETAILED DESCRIPTION OF PREFERRED EMBODIMENTS

Figure 1:
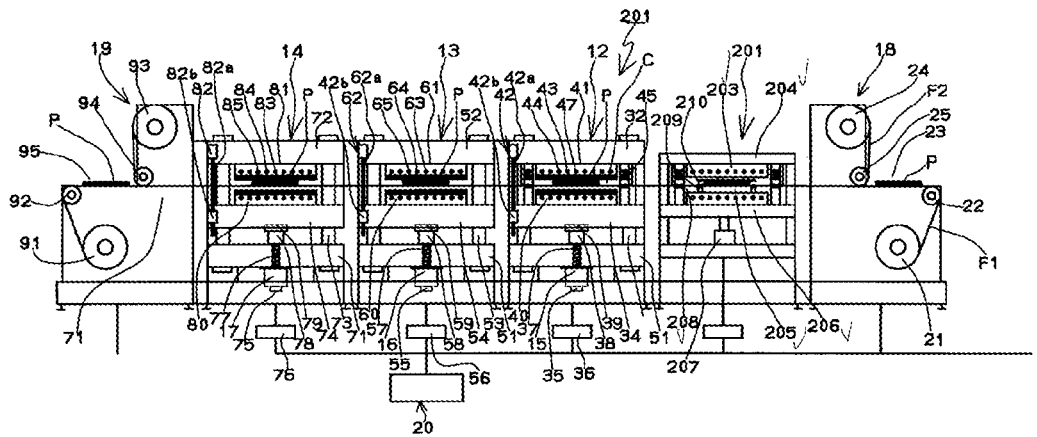
FIG. 1 is a schematic explanatory view of a laminate molding system of the present embodiment.

A laminate molding system 11 according to a first embodiment of the present invention will be described with reference to FIG. 1. The laminate molding system 11 includes a first press device 12 having a pressure reducable chamber VC and using a servomotor 15 as a drive source, a second press device 13 being provided continuously in a post-process of the first press device 12 and using a servomotor 16 as a drive source, and a third press device 14 being provided continuously in a post-process of the second press device 13 and using a servomotor 17 as a drive source. Therefore, in the present invention, at least two or more press devices 12, 13, and 14 are continuously provided.

The laminate molding system 11 includes a carrier film feeding device 18 in a pre-process of the first press device 12 and a carrier film winding device 19 in a post-process of the third press device 14. The laminate molding system 11 further includes a control device 20. The control device 20 is connected to the first press device 12, the second press device 13, the third press device 14, the carrier film feeding device 18, and the carrier film winding device 19, and controls the entire laminate molding system 11. In addition, the control device 20 has a function of measuring the plate thickness of the laminate molded article P by a position sensor at least at the end of pressurization by the press devices 12 and 13 in the pre-process, storing the same in a storage device 106, and using the measured plate thickness to control the press devices 13 and 14 in the post-process. Note that the control device 20 may be provided at a position separated from the device of the laminate molding system 11. As an example, in the same building, the device portion of the laminate molding system 11 and the control device 20 may have any distance as long as they are connected by a communication line. In addition, the device of the laminate molding system 11 and the control device may be connected by wireless communication. At least a part of the laminate molding system 11 and the control device 20 in other areas may be shared. In addition, a manufacturer of the laminate molding system 11 may have at least a part of the control device 20.

First, the carrier film feeding device 18 will be described in order from the pre-process. The carrier film feeding device 18 serving as both a transfer device for a laminate molded article P including a substrate having unevenness and a laminated film and a film tension device includes a lower unwinding roll 21 and a driven roll 22. The orientation of the lower carrier film F1 unwound from the unwinding roll 21 is changed to a horizontal state at a portion of the driven roll 22. A placement stage 23 for placing the laminate molded article P sent in an overlapping manner from the pre-process is provided at a portion where the lower carrier film F1 is changed to the horizontal state. The carrier film feeding device 18 includes an upper unwinding roll 24 and a driven roll 25, and the upper carrier film F2 unwound from the unwinding roll 24 is overlaid on the laminate molded article P at the portion of the driven roll 25. The laminate molded article P is transferred by being sandwiched between the carrier films F1 and F2. Then, when laminate molding is performed in order on the laminate molded article P through the carrier films F1 and F2 in the first press device 12, the second press device 13, and the third press device 14, the portion of the laminated film is prevented from melting and adhering to the device portion. The use of the carrier films F1 and F2 also has an advantage in that a certain buffer action is imparted when the laminate molded articles (the primary laminate molded article and the secondary laminate molded article) are pressurized, particularly in the second press device 13 and the third press device 14.

Next, the first press device 12 arranged in the post-process of the carrier film feeding device 18 will be described. The first press device 12 includes a pressure reducable chamber VC and a pressurizing surface of an elastic body sheet 43, and the laminate molded article is pressurized by a driving force of the servomotor 15. The first press device 12 pressurizes the laminate molded article P in the pressure reducable chamber VC to perform laminate molding on the primary laminate molded article. The first press device 12 includes a substantially rectangular base board 31 provided on the lower side, and four tie bars 33 provided upright between vicinities of four corners of an upper board 32 which is a substantially rectangular fixed board located above the base board 31. In the first press device 12, the lower board 34 which is a substantially rectangular movable board can be raised and lowered between the base board 31 and the upper board 32. The intervals between the base board 31, the upper board 32, the lower board 34, and the tie bars 33 of the first press device 12 are often larger than those of the upper board, the lower board, and the like of the second press device 13 and the third press device 14 to provide the pressure reducable chamber VC. The first press device 12 uses an electric motor such as a servomotor 15 as a drive source, and the servomotor 15 that is a driving means of a pressurizing mechanism is attached to the base board 31.

In the pressurizing mechanism of the first press device 12, the servomotor 15 includes a rotary encoder 35 which is a position sensor, and is connected to a servo amplifier 36, the servo amplifier 36 being connected to the control device 20. A ball screw 37 is connected to a drive shaft of the servomotor 15 through a speed reducer (not illustrated), or the drive shaft itself is directly connected to the ball screw. On the other hand, a ball screw nut 38 of a ball screw mechanism is fixed to the lower surface of the lower board 34, and the ball screw 37 is inserted into the ball screw nut 38. Furthermore, a load cell 39 which is a force detection unit is provided between the lower board 34 and the ball screw nut 38. More specifically, the ball screw nut 38 is attached to the lower board 34 through a bracket such that the ball screw 37 is movable upward, or a concave portion into which the ball screw 38 is inserted is provided on the lower surface of the lower board 34. When the bracket is interposed, the load cell 39 is attached between the bracket and the ball screw nut 38 or between the bracket and the lower board 34. The portion to which the load cell 39 is attached is not limited as long as it is a portion where the pressurizing force in the press process can be received, and may be an attachment portion of the servomotor 15 by way of an example. Note that the force detection unit may be a tie bar sensor attached to the tie bar 33 or the like.

With the above structure, in the first press device 12, the lower board 34 is raised and lowered with respect to the upper board 32 by the operation of the servomotor 15. In the ball screw mechanism of the first press device 12, a belt may be stretched between a pulley attached to a drive shaft of the servomotor 15 and a pulley attached to the ball screw 37, and driving force may be transmitted through the belt. A device using a belt or a device using a speed reducer using a worm gear in which the longitudinal direction of the servomotor 15 is not attached in the series direction with the ball screw 37 is advantageous in reducing the height of the first press device 12. In the first press device 12, since the rising/lowering stroke of the lower board 34 is relatively small and the pressurization time is relatively long as compared with the metal press or the like, it is desirable to use a transmission mechanism such as a speed reducer or a belt as a transmission mechanism of the driving force of the servomotor 15. Between when a speed reducer is used and when a belt is used, a case where the speed reducer is used is often advantageous in terms of noise, dust generated when the belt is used, and the like. Furthermore, in the ball screw mechanism of the first press device 12, a ball screw nut may be attached in a freely rotating manner to the base board 31, and the ball screw may be raised or lowered. In addition, by covering the portion of the ball screw 37 with a cover, diffusion of grease can be prevented, which contributes to an increase in cleanliness in a clean room.

Furthermore, the first press device 12 may use a booster mechanism such as a toggle mechanism, a crank mechanism, or a wedge mechanism, or a mechanism similar thereto. Furthermore, in the above example, the first press device 12 performs pressure-molding by a pressurizing mechanism using one servomotor 15, but a plurality of pressurizing mechanisms using a plurality of servomotors 15 of two or more such as two, three, or four, or two or more ball screw mechanisms may be provided. In a case where the number of the servomotors 15 is two, when the effective pressurizing surfaces of the pressurizing blocks 40 and 41 are rectangular, two pressurizing mechanisms are desirably provided along the center line parallel to the long sides. When the number of servomotors 15 is four, four pressurizing mechanisms are desirably provided along the portion of the tie bar 33 or the diagonal line of the rectangular base board 31 on the inner side of the tie bar 33. Furthermore, other than the servomotor 15, a motor such as a closed-loop controllable linear motor may be used. Furthermore, the pressurizing mechanism may use a hydraulic cylinder. Moreover, in the first press device 12, the upper board 32 may be raised and lowered with respect to the lower board 34 using the above-described pressurizing mechanism.

A position sensor such as a linear scale 42 is attached between the side surface of the upper board 32 and the side surface of the lower board 34 separately from the rotary encoder 35 of the servomotor 15. In the linear scale 42, a scale 42a is attached to one of the boards, and a slider 42b which is a measuring unit is attached to the other board. The position (distance) of the lower board 34 with respect to the upper board 32 can also be detected by the rotary encoder 35 of the servomotor 15. However, a slight backlash exists between the ball screw 37 and the ball screw nut 38, and thermal expansion occurs in the tie bar 33 and the ball screw 37. Therefore, it is often desirable to directly measure either one of the distance between the pressurizing blocks 40 and 41, the position of the lower board 34 with respect to the upper board 32 (distance between the tables), and the distance between the base board 31 and the lower board 34 by the linear scale 42. The resolution of the position sensor such as the linear scale 42 is desirably less than or equal to 0.002 mm by way of an example, and is more desirably less than or equal to 0.001 mm and greater than or equal to a unit of minimum resolution such as resolution of 0.0001 mm or resolution of 0.000025 mm which is practically used.

Only one position sensor such as the linear scale 42 may be attached to the first press device 12, but a total of two position sensors may be attached, one on each side surface, or a total of four position sensors may be attached, two on each side surface on both sides of the upper board 32 and the lower board 34 with respect to an advancing direction of the carrier films F1 and F2. When two pressurizing mechanisms are provided along the advancing direction of the carrier films F1 and F2, one position sensor is provided on the side surface on one side parallel to the advancing direction of the carrier films F1 and F2 in correspondence with the position of one pressurizing mechanism. In addition, on the side surface on the other side parallel to the advancing direction of the carrier films F1 and F2, another position sensor is provided in correspondence with the position of the other pressurizing mechanism. In addition, in a case where a total of four position sensors are attached to the side surfaces on both sides and four servomotors are provided, the servomotors are controlled by the respective position sensors, so that the parallelism of the lower board 34 with respect to the upper board 32 is detected and control can be performed so that the lower board 34 becomes parallel to the upper board 32. Alternatively, the position where the position sensor is provided may be a position where the pressurizing block 40 and the pressurizing block 41 are connected or a position where the base board 31 and the lower board 34 are connected. Furthermore, the first press device 12 generally includes a safety switch capable of detecting a position such as a limit switch or a proximity switch (not illustrated) for the purpose of, for example, preventing the position of the lower board 34 from exceeding a lowering limit point or a rising limit point in mechanical design.

The pressurizing block 40 and the pressurizing block 41 are respectively attached to the opposing surfaces of the upper board 32 and the lower board 34 of the first press device 12 through a heat insulating plate (not illustrated). Since the pressurizing blocks 40 and 41 have substantially the same structure, one pressurizing block 40 will be described. The pressurizing block 40 has a temperature control means such as a cartridge heater 47 provided inside, or a rubber heater or the like provided on the surface. An elastic body sheet 43 made of a heat-resistant rubber film is attached to the surface of the pressurizing block 40, and a thin metal plate 44 is attached thereto. In the above description, the elastic body sheet 43 is made of heat-resistant rubber such as silicone rubber or fluoro-rubber, and has a thickness of 0.2 mm to 5.0 mm. The elastic body sheet 43 constitutes a pressurizing surface.

Next, the configuration of the pressure reducable chamber VC of the first press device 12 will be described. An upper outer frame portion 45 for forming a part of the chamber VC is attached downward to a portion around the portion where the pressurizing block 41 is attached in the upper board 32. Furthermore, a lower outer frame portion 46 for forming a part of the chamber VC is attached upward to a portion around the portion where the pressurizing block 40 is attached in the lower board 34. The chamber VC can be formed inside when an abutment surface of the outer frame portion 45 and an abutment surface of the outer frame portion 46 come into contact with each other. The height of at least one of the outer frame portions 45 and the like can be changed by using an elastic body such as a spring or rubber. Furthermore, a seal member such as an O-ring is attached to an abutment surface of at least one outer frame portion 46 or the like. Furthermore, the member forming the chamber VC may be another means such as a bellows made of rubber. In addition, the chamber VC is not configured by driving the servomotor 15 of the pressurizing mechanism, but the operation mechanism of the member configuring the chamber VC and the pressurizing mechanism of the laminate molded article P may be configured by different mechanisms. The chamber VC of the first press device 12 is connected to a vacuum pump (not illustrated) via a pipeline, and the chamber VC in a vacuum state can be formed by sucking the atmosphere in the chamber VC. Therefore, the first press device 12 configures a vacuum laminating device. In the present invention, the degree of vacuum of the chamber VC in a pressure reducable state is not limited.

Next, a description will be made on the second press device 13 disposed continuously in the series direction in the post-process of the first press device 12. The second press device 13 includes a pressurizing surface of the metal press plate 65, and the laminate molded article P is pressurized by a driving force of the servomotor 16. The second press device 13 further pressurizes the laminate molded article P (primary laminate molded article) which is pressure-molded by the first press device 12, is formed of the substrate having uneven portions and the laminated film and is in a state where unevenness remains on the laminated film side to pressure-mold to a flatter laminate molded article P (secondary laminate molded article). The second press device 13 includes a substantially rectangular base board 51 provided on the lower side, and four tie bars 53 provided upright between vicinities of four corners of an upper board 52 which is a substantially rectangular fixed board located above the base board 51. In the second press device 13, the lower board 54 which is a substantially rectangular movable board can be raised and lowered between the base board 51 and the upper board 52. The second press device 13 uses an electric motor such as a servomotor 16 as a drive source, and the servomotor 16 that is a driving means of a pressurizing mechanism is attached to the base board 51.

In the pressurizing mechanism of the second press device 13, the servomotor 16 includes a rotary encoder 55, and is connected to a servo amplifier 56, the servo amplifier 56 being connected to the control device 20. A ball screw 57 is connected to a drive shaft of the servomotor 16 through a speed reducer (not illustrated), or the drive shaft itself is directly connected to the ball screw 57. On the other hand, a ball screw nut 58 of a ball screw mechanism is fixed to the lower surface of the lower board 54, and the ball screw 57 is inserted into the ball screw nut 58. Furthermore, a load cell 59 which is a force detection unit is provided between the lower board 54 and the ball screw nut 58. More specifically, the ball screw nut 58 is attached to the lower board 54 through a bracket such that the ball screw 57 is movable upward, or a concave portion into which the ball screw 58 is inserted is provided on the lower surface of the lower board 54. When the bracket is interposed, the load cell 59 is attached between the bracket and the ball screw nut 58 or between the bracket and the lower board 54. The portion to which the load cell 59 is attached is not limited as long as it is a portion where the pressurizing force in the press process can be received, and may be an attachment portion of the servomotor 16 by way of an example. Note that the force detection unit may be a tie bar sensor attached to the tie bar 53 or the like.

With the above structure, in the second press device 13, the lower board 54 is raised and lowered with respect to the upper board 52 by the operation of the servomotor 16. In the ball screw mechanism of the second press device 13, a belt may be stretched between a pulley attached to a drive shaft of the servomotor 16 and a pulley attached to the ball screw 57, and driving force may be transmitted through the belt. A device using a belt or a device using a speed reducer using a worm gear in which the longitudinal direction of the servomotor 16 is not attached in the series direction with the ball screw 57 is advantageous in reducing the height of the second press device 13. In the second press device 13, since the rising/lowering stroke of the lower board 54 is relatively small and the pressurization time is relatively long as compared with the metal press or the like, it is desirable to use a transmission mechanism such as a speed reducer or a belt as a transmission mechanism of the driving force of the servomotor 16. Between when a speed reducer is used and when a belt is used, a case where the speed reducer is used is often advantageous in terms of noise, dust generated when the belt is used, and the like. Furthermore, in the ball screw mechanism of the second press device 13, a ball screw nut may be attached in a freely rotating manner to the base board 51, and the ball screw may be raised or lowered. In addition, by covering the portion of the ball screw 57 with a cover, diffusion of grease can be prevented, which contributes to an increase in cleanliness in a clean room. Furthermore, the second press device 13 may use a booster mechanism such as a toggle mechanism, a crank mechanism, or a wedge mechanism, or a mechanism similar thereto. Furthermore, in the above example, the second press device 13 performs pressure-molding by a pressurizing mechanism using one servomotor 16, but may be a pressurizing mechanism using two or more servomotors 16 such as two, three, or four, or two or more ball screw mechanisms. Furthermore, other than the servomotor, a motor such as a closed-loop controllable linear motor may be used. Furthermore, the pressurizing mechanism may use a hydraulic cylinder. Moreover, in the second press device 13, the upper board 52 may be raised and lowered with respect to the lower board 54 using the above-described pressurizing mechanism.

A linear scale 62 which is a position sensor is attached between the side surface of the upper board 52 and the side surface of the lower board 54 separately from the rotary encoder 55 of the servomotor 16. In the linear scale 62, a scale 62a is attached to one of the boards, and a slider 62b which is a measuring unit is attached to the other board. The position (distance) of the lower board 54 with respect to the upper board 52 can also be detected by the rotary encoder 55 of the servomotor 16. However, a slight backlash exists between the ball screw 57 and the ball screw nut 58, and thermal expansion occurs in the tie bar 53 and the ball screw 57. Therefore, it is often desirable to directly measure either one of the distance between the pressurizing blocks 60 and 61, the position of the lower board 54 with respect to the upper board 52 (distance between the tables), and the distance between the base board 51 and the lower board 54 by the linear scale 62. The resolution of the position sensor such as the linear scale 62 is desirably less than or equal to 0.002 mm by way of an example, and is more desirably less than or equal to 0.001 mm and greater than or equal to a unit of minimum resolution such as resolution of 0.0001 mm or resolution of 0.000025 mm which is practically used.

Only one position sensor such as the linear scale 62 may be attached to the second press device 13, but a total of two position sensors may be attached, one on each side surface, or a total of four position sensors may be attached, two on each side surface on both sides of the upper board 52 and the lower board 54 with respect to an advancing direction of the carrier films F1 and F2. In addition, in a case where a total of four position sensors are attached to the side surfaces on both sides and four servomotors are provided, the servomotors are controlled by the respective position sensors, so that the parallelism of the lower board 54 with respect to the upper board 52 is detected and control can be performed so that the lower board 54 becomes parallel to the upper board 52. Alternatively, the position where the position sensor is provided may be a position where the pressurizing block 60 and the pressurizing block 61 are connected or a position where the base board 51 and the lower board 54 are connected. Furthermore, the second press device 13 generally includes a safety switch capable of detecting a position such as a limit switch or a proximity switch (not illustrated) for the purpose of, for example, preventing the position of the lower board 54 from exceeding a lowering limit point or a rising limit point in mechanical design.

The pressurizing block 60 and the pressurizing block 61 are respectively attached to the opposing surfaces of the upper board 52 and the lower board 54 of the second press device 13 through a heat insulating plate (not illustrated). Since the pressurizing blocks 60 and 61 have substantially the same structure, one pressurizing block 60 will be described. The pressurizing block 60 has a temperature control means such as a cartridge heater 63 provided inside, or a rubber heater or the like provided on the surface. A buffer material 64 such as rubber, a resin film, or a fiber sheet is attached to the surface of the pressurizing block 60. The thickness of the buffer material 64 is, for example, 0.05 mm to 3.00 mm. As an example, a metal press plate 65 made of an elastically deformable material such as stainless steel having a plate thickness of 0.2 mm to 3.00 mm is attached to the surface of the buffer material 64. A surface opposite to a surface, that comes into contact with the buffer material 64, in the metal press plate 65 is a pressurizing surface.

Note that the member configuring the pressurizing surface of the second press device 13 may be an elastic body sheet having heat resistance, such as a silicone rubber or a fluoro-rubber sheet. In that case, the hardness (Shore A hardness) of the elastic body sheet is not limited thereto, but as an example, that of 30 to 80, and more preferably 40 to 70 is used. Furthermore, in FIG. 1, the second press device 13 does not include a chamber capable of being in a vacuum state, but may include a chamber capable of being in a vacuum state similarly to the first press device 12, and pressure-molding may be performed in the vacuum chamber.

Next, a description will be made on the third press device 14 disposed continuously in the series direction in the post-process of the second press device 13. The third press device 14 includes a pressurizing surface of the metal press plate 85, and the laminate molded article P is pressurized by a driving force of the servomotor 17. The third press device 14 further pressurizes the laminate molded article P (secondary laminate molded article) which is pressure-molded by the second press device 13, and is in a state where unevenness slightly remains on the laminated film side or in a state where it is already flat to pressure-mold to a final flat laminate molded article P (tertiary laminate molded article) within an allowable range. The configuration of the third press device 14 is basically the same as that of the second press device 13. The third press device 14 includes a substantially rectangular base board 71 provided on the lower side, and four tie bars 73 provided upright between vicinities of four corners of an upper board 72 which is a substantially rectangular fixed board located above the base board 71. In the third press device 14, the lower board 74 which is a substantially rectangular movable board can be raised and lowered between the base board 71 and the upper board 72. The third press device 14 uses an electric motor such as a servomotor 17 as a drive source, and the servomotor 17 that is a driving means of a pressurizing mechanism is attached to the base board 71.

In the pressurizing mechanism of the third press device 14, the servomotor 17 includes a rotary encoder 75, and is connected to a servo amplifier 76, the servo amplifier 76 being connected to the control device 20. A ball screw 77 is connected to a drive shaft of the servomotor 17 through a speed reducer (not illustrated), or the drive shaft itself is directly connected to the ball screw 77. On the other hand, a ball screw nut 78 of a ball screw mechanism is fixed to the lower surface of the lower board 74, and the ball screw 77 is inserted into the ball screw nut 78. Furthermore, a load cell 79 which is a force detection unit is provided between the lower board 74 and the ball screw nut 78. More specifically, the ball screw nut 78 is attached to the lower board 74 through a bracket such that the ball screw 77 is movable upward, or a concave portion into which the ball screw 78 is inserted is provided on the lower board 74. When the bracket is interposed, the load cell 79 is attached between the bracket and the ball screw nut 78 or between the bracket and the lower board 74. The portion to which the load cell 79 is attached is not limited as long as it is a portion where the pressurizing force in the press process can be received, and may be an attachment portion of the servomotor 17 by way of an example. Note that the force detection unit may be a tie bar sensor attached to the tie bar 73 or the like.

With the above structure, in the third press device 14, the lower board 74 is raised and lowered with respect to the upper board 72 by the operation of the servomotor 17. In the ball screw mechanism of the third press device 14, a belt may be stretched between a pulley attached to a drive shaft of the servomotor 17 and a pulley attached to the ball screw 77, and driving force may be transmitted through the belt. A device using a belt or a device using a speed reducer using a worm gear in which the longitudinal direction of the servomotor 17 is not attached in the series direction with the ball screw 77 is advantageous in reducing the height of the third press device 14. In the third press device 14, since the rising/lowering stroke of the lower board 74 is relatively small and the pressurization time is relatively long as compared with the metal press or the like, it is desirable to use a transmission mechanism such as a speed reducer or a belt as a transmission mechanism of the driving force of the servomotor 17. Between when a speed reducer is used and when a belt is used, a case where the speed reducer is used is often advantageous in terms of noise, dust generated when the belt is used, and the like. Furthermore, in the ball screw mechanism of the third press device 14, a ball screw nut may be attached in a freely rotating manner to the base board 71, and the ball screw may be raised or lowered. In addition, by covering the portion of the ball screw 77 with a cover, diffusion of grease can be prevented, which contributes to an increase in cleanliness in a clean room. Furthermore, the third press device 14 may use a booster mechanism such as a toggle mechanism, a crank mechanism, or a wedge mechanism, or a mechanism similar thereto. Furthermore, in the above example, the third press device 14 performs pressure-molding by a pressurizing mechanism using one servomotor 17, but may be a pressurizing mechanism using two or more servomotors 17 such as two, three, or four, or two or more ball screw mechanisms such as two, three, or four. Furthermore, other than the servomotor, a motor such as a closed-loop controllable linear motor may be used. Furthermore, the pressurizing mechanism may use a hydraulic cylinder. Moreover, in the third press device 14, the upper board 72 may be raised and lowered with respect to the lower board 74 using the above-described pressurizing mechanism.

A linear scale 82 which is a position sensor is attached between the side surface of the upper board 72 and the side surface of the lower board 74 separately from the rotary encoder 75 of the servomotor 17. In the linear scale 82, a scale 82a is attached to one of the boards, and a slider 82b which is a measuring unit is attached to the other board. The position (distance) of the lower board 74 with respect to the upper board 72 can also be detected by the rotary encoder 75 of the servomotor 17. However, a slight backlash exists between the ball screw 77 and the ball screw nut 78, and thermal expansion occurs in the tie bar 73 and the ball screw 77. Therefore, it is often desirable to directly measure either one of the distance between the pressurizing blocks 80 and 81, the position of the lower board 74 with respect to the upper board 72 (distance between the tables), and the distance between the base board 71 and the lower board 74 by the linear scale 82. The resolution of the position sensor such as the linear scale 82 is desirably less than or equal to 0.002 mm by way of an example, and is more desirably less than or equal to 0.001 mm and greater than or equal to a unit of minimum resolution such as resolution of 0.0001 mm or resolution of 0.000025 mm which is practically used.

Only one position sensor such as the linear scale 82 may be attached to the third press device 14, but a total of two position sensors may be attached, one on each side surface, or a total of four position sensors may be attached, two on each side surface on both sides of the upper board 72 and the lower board 74 with respect to an advancing direction of the carrier films F1 and F2. In addition, in a case where a total of four position sensors are attached to the side surfaces on both sides and four servomotors are provided, the servomotors are controlled by the respective position sensors, so that the parallelism of the lower board 74 with respect to the upper board 72 is detected and control can be performed so that the lower board 74 becomes parallel to the upper board 72. Alternatively, the position where the position sensor is provided may be a position where the pressurizing block 80 and the pressurizing block 81 are connected or a position where the base board 71 and the lower board 74 are connected. Furthermore, the third press device 14 generally includes a safety switch capable of detecting a position such as a limit switch or a proximity switch (not illustrated) for the purpose of, for example, preventing the position of the lower board 74 from exceeding a lowering limit point or a rising limit point in mechanical design.

The pressurizing block 80 and the pressurizing block 81 are respectively attached to the opposing surfaces of the upper board 72 and the lower board 74 of the third press device 14 through a heat insulating plate (not illustrated). Since the pressurizing blocks 80 and 81 have substantially the same structure, one pressurizing block 80 will be described. The pressurizing block 80 has a temperature control means such as a cartridge heater 83 provided inside, or a rubber heater or the like provided on the surface. A buffer material 84 such as rubber, a resin film, or a fiber sheet is attached to the surface of the pressurizing block 80. The thickness of the buffer material 84 is, for example, 0.05 mm to 3.00 mm. As an example, a metal press plate 85 made of an elastically deformable material such as stainless steel having a plate thickness of 0.2 mm to 3.00 mm is attached to the surface of the buffer material 84. A surface opposite to a surface, that comes into contact with the buffer material 84, in the metal press plate 85 is a pressurizing surface.

Note that the member configuring the pressurizing surface of the third press device 14 may be an elastic body sheet having heat resistance, such as a silicone rubber or a fluoro-rubber sheet. In that case, the hardness (Shore A hardness) of the elastic body sheet is not limited thereto, but as an example, that of 30 to 80, and more preferably 40 to 70 is used. Furthermore, in FIG. 1, the third press device 14 does not include a chamber capable of being in a vacuum state, but may include a chamber capable of being in a vacuum state similarly to the first press device 12, and may perform pressure-molding in the vacuum chamber.

Next, the carrier film winding device 19 provided in a post-process of the third press device 14 will be described. The carrier film winding device 19 serves as both a transfer device and a tension device for the carrier films F1 and F2. The carrier film winding device 19 includes a lower winding roll 91 and a driven roll 92, and the lower carrier film F1 is wound by the winding roll 91. The carrier film winding device 19 includes an upper winding roll 93 and a driven roll 94, the upper carrier film F2 is peeled off from the laminate molded article P which is a final molded article at the portion of the driven roll 94, and the upper carrier film F2 is wound around the upper winding roll 93. A take-out stage 95 of the laminate molded article P is provided at a portion where only the lower carrier film F1 is fed in the horizontal state. As the transfer device of the carrier films F1 and F2, a transfer device (so-called chuck device) that grips both sides of the carrier films F1 and F2 and pulls the carrier films F1 and F2 for the post-process may be provided.

Figure 2:
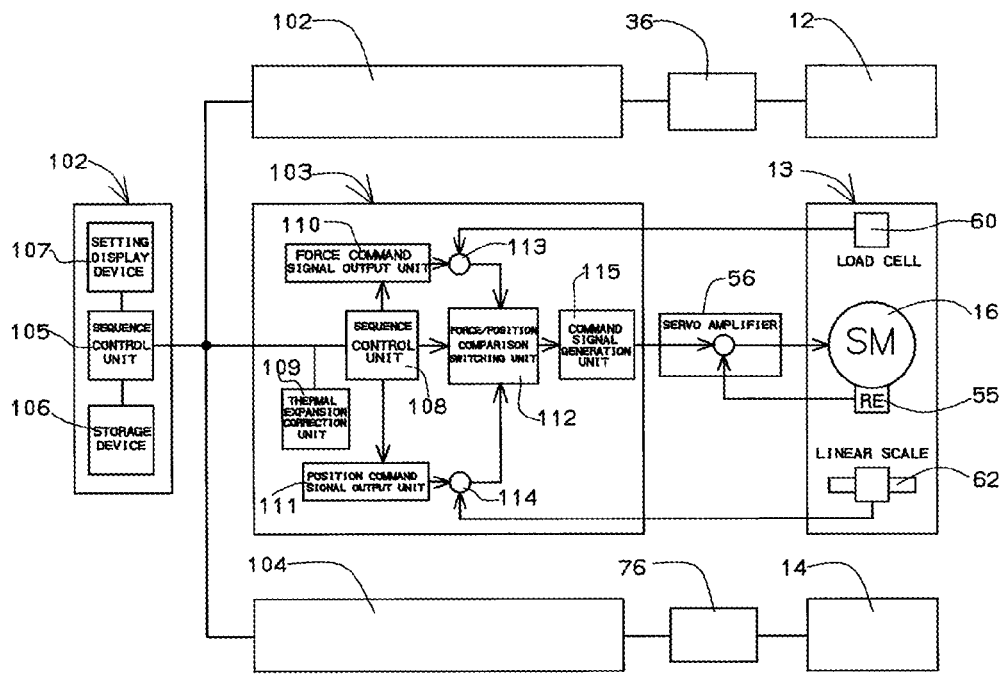
FIG. 2 is a block diagram of a control device of the laminate molding system of the present embodiment.

Next, a block diagram of the control device 20 of the laminate molding system 11 will be described with reference to FIG. 2. The control device 20 includes an integrated control unit 101, a first press device control unit 102, a second press device control unit 103, and a third press device control unit 104. Note that, although the description is made here as a block for each function in an easy-to-understand manner, the function of the integrated control unit 101 may be dispersedly provided in each press device control unit 102, 103, 104 provided in each of the press devices 12, 13, and 14, or the function of each press device control unit may not be provided in each of the press devices 12, 13, and 14, and may be provided at one place together with the integrated control unit 101.

In addition to each of the press devices 12, 13, and 14, the integrated control unit 101 is provided with a sequence control unit 105 that controls the sequence of the entire laminate molding system 11 including a conveyance mechanism formed by the carrier film feeding device 18 and the carrier film winding device 19. In addition, a storage device 106 is provided to be connected to the sequence control unit 105. The storage device 106 stores various types of molding conditions and actual measurement data at the time of molding. In relation to the present invention, it is provided to measure the plate thickness of the laminate molded article P by a position sensor at least at the end of pressurization of the press device in the pre-process, store the measured plate thickness in the storage device 106, and use the measured plate thickness for control of the press device in the post-process. Furthermore, the integrated control unit 101 is provided with a setting display device 107.

Since the contents of the first press device control unit 102, the second press device control unit 103, and the third press device control unit 104 are substantially common, the second press device control unit 103 that controls the second press device 13 will be described. The second press device control unit 103 is provided with a sequence control unit 108, and the sequence control unit 108 is connected to a thermal expansion correction unit 109 for correcting the control value in correspondence with the thermal expansion of the press device. The sequence control unit 108 is further connected to a force command signal output unit 110 and a position command signal output unit 111. The force command signal output unit 110 is connected to a force/position comparison switching unit 112, but an adder 113 is provided in the middle of the connection line, and the adder 113 is connected to the load cell 59, and addition or subtraction are performed on the force command signal. On the other hand, the position command signal output unit 111 is also connected to the force/position comparison switching unit 112, but an adder 114 is provided in the middle of the connection line, and the adder 114 is connected to the linear scale 62, and addition or subtraction are performed on the position command signal. The force/position comparison switching unit 112 is connected to a command signal generation unit 115, and the command signal generation unit 115 generates a command signal transmitted to the servo amplifier 56.

In addition, the second press device 13 includes the servomotor 16 that is a driving means and the rotary encoder 55. The servomotor 16 is connected to the servo amplifier 56, and electric power for driving the servomotor 16 is supplied from the servo amplifier 56. The rotary encoder 55 is also connected to the servo amplifier 56, and the rotation angle (the number of pulses) of the servomotor 16 is detected by the rotary encoder 55, sent to the servo amplifier 56, fed back to an adder (not illustrated) in the servo amplifier 56, and collated with the position command pulse. Note that the control block of the first press device 12 has a function for pressure reducing the chamber VC in addition to the control block of the second press device 13.

Next, a method for laminate molding the laminate molded article P using the laminate molding system 11 of the first embodiment will be described with reference to FIGS. 3 to 6. Before starting laminate molding in the laminate molding system 11, the origin setting of the position sensors 42, 62, and 82 of the first press device 12, the second press device 13, and the third press device 14 is first performed. At least the signals from the rotary encoders 55 and 75 of the servomotors 16 and 17 of the second press device 13 and the third press device 14 are performed with origin setting by the press control unit. Here, the second press device 13 will be described as an example, but the same applies to the origin setting of the other press devices 12 and 14. First, the servomotor 16 is operated in a state where only the carrier films F1 and F2 are present between the pressurizing blocks 60 and 61. Then, the lower board 54 and the pressurizing block 60 are raised, the pressurizing block 60 abutting through the carrier films F1 and F2, and the position at the time point when the load cell 59 reaches a predetermined value or the torque of the servomotor 16 reaches a predetermined value is stored as the origin (control origin) of the linear scale 62 and the origin (control origin) of the rotary encoder 55 in the storage device 106 or the storage device (not illustrated) of the second press device 13. At this time, the origin position may be detected and stored with a dummy substrate having rigidity that is not deformed by pressing interposed between the carrier films F1 and F2. In addition, in a case where a mechanism for removing backlash between the ball screw 57 and the ball screw nut 58 by a spring or the like is provided, the origin position may be detected and stored at the mold opening position where the lower board 34 is lowered to the lowermost stage. The timing of detection and storage of the origin position of the laminate molding system 11 is desirably performed at the time of replacement of the buffer material 64, the metal press plate 65, the heat insulating plate (not illustrated), or the like, but may be performed for each predetermined shot or at the time of replacement of the type of the laminate molded article A.

In the laminate molding system 11 at the time of continuous molding, laminate molding is simultaneously performed in batch processing in the first press device 12, the second press device 13, and the third press device 14 by sequence control of the control device 20. However, here, the description will be given along the molding order of the laminate molded article for one batch.

The to-be-laminated material of the laminate molded article P placed on the placement stage 23 of the carrier film feeding device 18 is a circuit board for build-up having an uneven portion including a convex portion of a copper foil portion adhered to a substrate surface and a concave portion of a portion not having a copper foil. The thickness (height with respect to the substrate portion) of the copper foil is not limited thereto, but is about several μm to several tens μm, and is 0.1 mm or less in most cases. A laminated film is overlapped on each of upper and lower sides of the circuit board to form a laminate molded article for build-up molding. In addition, the laminated film of the laminate molded article P is an interlayer insulating film containing a thermosetting resin as a main component, and as an example, SiO2 which is an inorganic material is contained in an amount of 35 to 75 wt %, and the fluidity when the laminated film is in a molten state is lower than that in the case of only resin. The laminated film is overlapped on at least one of an upper side and a lower side of the circuit board, and is overlapped on both sides in the present embodiment. Although one laminate molded article P is illustrated in FIG. 1, a plurality of laminate molded articles P may be simultaneously placed on the placement stage 23 and laminate molded.

Then, the laminate molded article P placed on the placement stage 23 is moved together with the upper and lower carrier films F1 and F2 with the rotational driving of the winding rolls 91 and 93, and is fed into and positioned in the chamber VC of the first press device 12 in the open state. Next, a first press process by the first press device 12 is started. The first press process by the first press device 12 will be described with reference to the graph of FIG. 3. When the cycle of the first press process is started, the lower board 34 is raised by the drive of the servomotor 15 of the pressurizing mechanism, and the abutment surface of the outer frame portion 45 and the abutment surface of the outer frame portion 46 are abutted with each other through the carrier films F1 and F2 to form the chamber VC. Then, the pressure is reduced by a vacuum pump (not illustrated) to form the chamber VC in a vacuum state (pressure reduced state).

When the servomotor 15 is further driven, the outer frame portion 45 is contracted, and the upper surface of the laminate molded article P abuts on the pressurizing surface formed of the elastic body sheet 43 of the pressurizing block 41 fixed to the upper board 32. Pressurization is started at this time point at a portion of a molded article contact (initial molded article plate thickness) described on the left side in FIG. 3. In the first press process, the value of the load cell 39 is detected and the servomotor 15 is driven to perform closed-loop control by force control. More specifically, the value of the load cell 39 is added or subtracted with respect to the force command signal transmitted from the force command signal output unit 110 by the adder 113, and is transmitted to the servo amplifier 56 as a command signal by the command signal generation unit 115 through the force/position comparison switching unit 112. The pressurizing force (pressure (surface pressure) per area applied to the laminate molded article) at this time is, for example, 0.3 MPa to 3.0 MPa. Although the force control is performed in the control of the servomotor 15, it is easier to recognize the pressure (surface pressure) on a display screen or the like. When the load cell 39 detects that the pressurizing force has reached the set predetermined molding pressure, the pressure-boosting is completed, and the closed loop control is performed to maintain the predetermined pressure.

Figure 3:
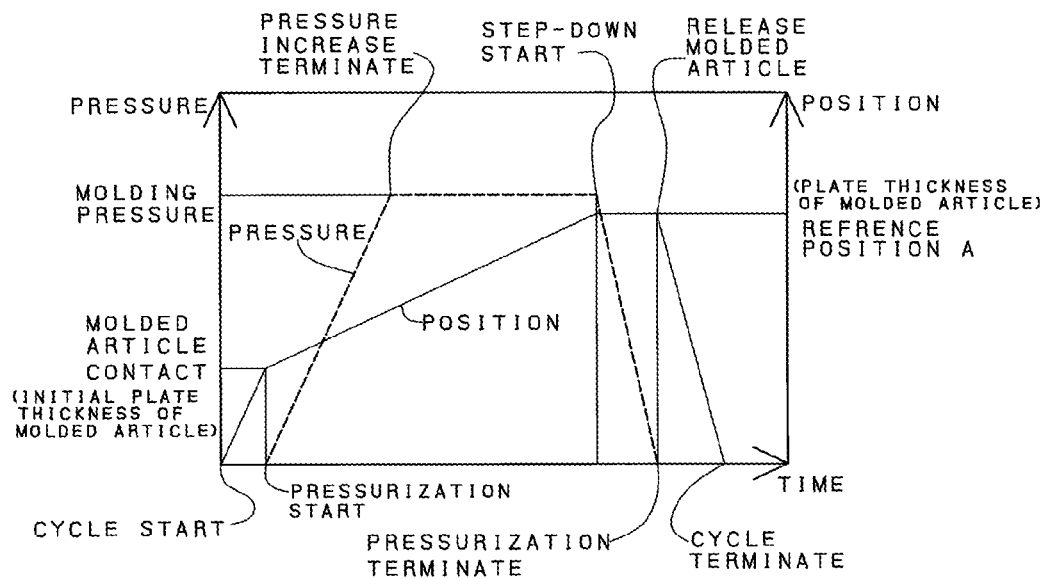
FIG. 3 is a graph showing a relationship between pressure and position in a first press process by a first press device and a second press process by a second press device.

At this time, the position control is not performed, but the distance between the pressurizing blocks 40, 41 gradually decreases as illustrated in FIG. 3. That is, the plate thickness of the laminate molded article P gradually decreases. The temperature of the pressurizing blocks 40 and 41 of the first press device 12 at this time varies depending on the material of the laminate molded article, but is temperature controlled to 50° C. to 200° C., more preferably to 80° C. to 150° C. In the first press device 12, since the pressurizing surfaces on both the upper and lower sides are the elastic body sheet 43 having the above-described hardness and thickness, only the convex portion of the substrate is prevented from being strongly pressed, the substrate and the laminated film are adhered to each other in such a manner that the laminated film is embedded in the concave portion of the substrate, and the laminate molded article P (primary laminate molded article) is laminate molded. However, the surface of the laminated film of the laminate molded article P (primary laminate molded article) laminate molded by the first press device 12 still has unevenness conforming to the shape of the uneven portion of the substrate.

When a predetermined time elapses, the pressurizing force control is terminated and the step-down is started. When the pressurization is terminated and the pressurizing force becomes 0, as shown in FIG. 3, this point of time is the molded article releasing point, which is also the thickness of the final molded article plate thickness. From there, the servomotor 15 is driven in the reverse direction to lower the lower board 34 and the pressurizing block 40. The atmospheric air may be introduced into the chamber VC in the pressure reduced state from the time point when step-down is started, from the time point when the pressurization is terminated, or in the middle thereof. When the inside of the chamber VC reaches atmospheric pressure, the lower board 34 is lowered by the driving of the servomotor 15, and the laminate molded articles P (primary laminate molded articles) abutted through the carrier films F1 and F2 are released from the pressurizing surfaces of the respective pressurizing blocks 40, 41. Then, after the inside of the chamber VC becomes the atmospheric pressure state, the chamber VC is opened. Furthermore, the laminate molded article P (primary laminate molded article) is conveyed between the upper board 52 and the lower board 54 of the second press device 13 in the post-process by feeding the carrier films F1 and F2 by the carrier film winding device 19, and is stopped at a predetermined pressurizing position.

In the present embodiment, only the force control is performed in the first press process of the first press device 12, but at least the force control may be performed. That is, position control (including speed control) may be used in combination from the beginning, after elapse of a predetermined time, or after reaching a predetermined position. When the driving means of the first press device 12 is a hydraulic cylinder, the force control portion is replaced with pressure control. In the first embodiment, when only force control (pressure control) is performed or when control including an element of force control (pressure control) is performed, the plate thickness of the laminate molded article P (primary laminate molded article) in which pressure-molding is terminated is not completely controlled to be the same. However, although not essential in the first press device 12 in the present invention, the plate thickness of the laminate molded article P (primary laminate molded article) may be measured by the linear scale 42 at least at the time of termination of the pressure-molding by the first press device 12. When the plate thickness of the laminate molded article P is measured, the measurement value is used to control the second press device 13 which is a press device in a post-process.

Figure 5:
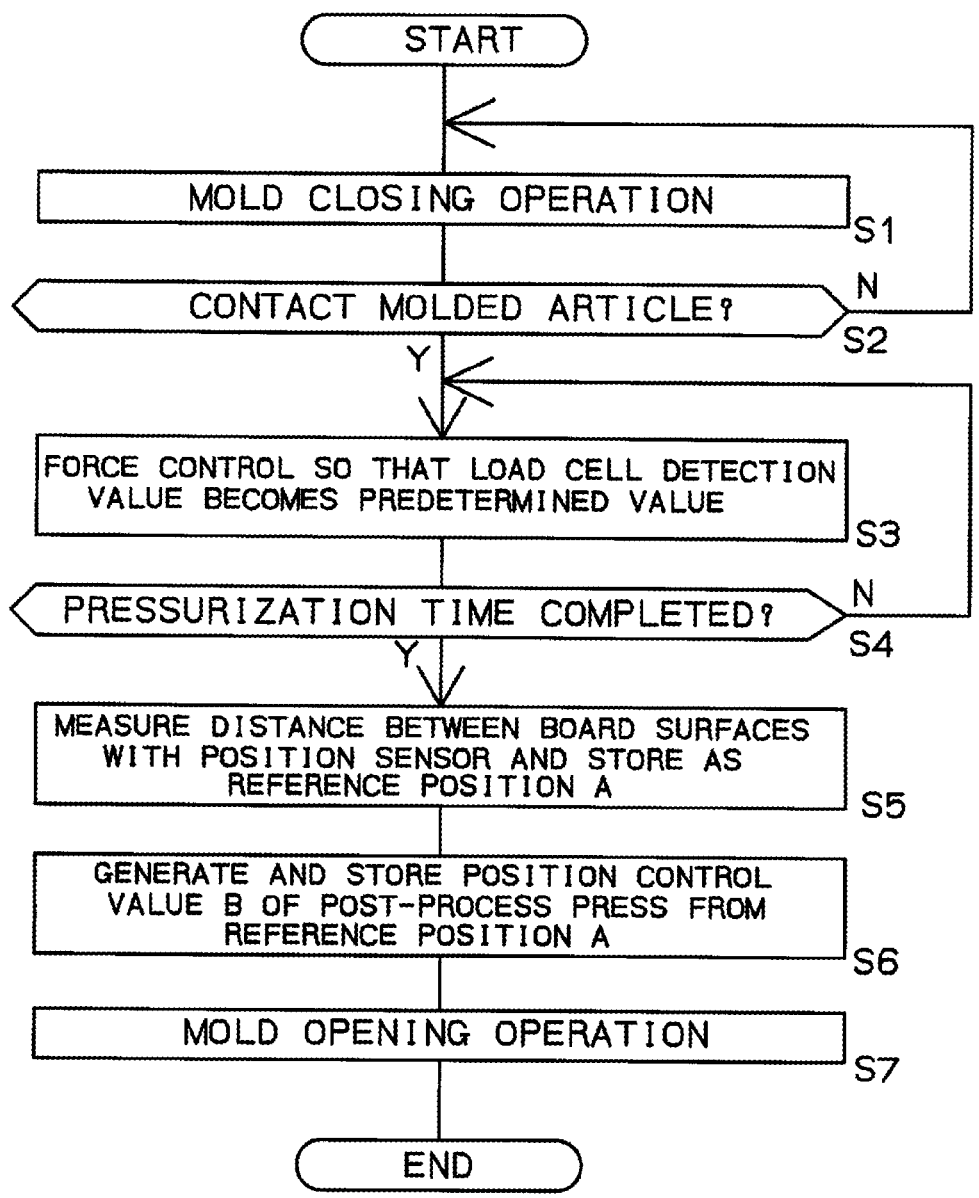
FIG. 5 is a flowchart illustrating control of a second press process by the second press device.

Next, the second press process by the second press device 13 will be described with reference to the graph of FIG. 3 and the flowchart of FIG. 5. The servomotor 16 of the second press device 13 is operated, the lower board 54 and the pressurizing block 60 are raised, and the mold closing operation of the second press process is started (S1). When the laminate molded article P on the pressurizing surface of the pressurizing block 60 attached to the lower board 54 and the pressurizing surface of the pressurizing block 60 attached to the upper board 52 come into contact with each other (S2=Y), pressurization is then started. In the second press process as well, similarly to the first press process of the first press device 12, closed loop control using force control (pressure control) as illustrated in FIG. 3 is performed. Specifically, force control is performed by feedback control for driving the servomotor 16 so that the detection value of the load cell 59 becomes the set value (S3). The relationship with the block diagram of FIG. 2 at this time is the same as the first press process by the first press device 12, and thus the description thereof will be omitted here.

The pressurizing force (pressure per area applied to the laminate molded article) at this time is, for example, 0.3 MPa to 3.0 MPa. Although the force control is performed in the control of the servomotor 16, it is easier to recognize the pressure (surface pressure) on a display screen or the like.

When the load cell 59 detects that the pressurizing force has reached the set predetermined molding pressure, the pressure-boosting is completed, and the closed loop control is performed to maintain the predetermined pressure.

The temperature of the pressurizing blocks 60 and 61 of the second press device 13 at this time varies depending on the material of the laminate molded article, but is temperature controlled to 50° C. to 200° C., more preferably to 80° C. to 150° C. In the second press device 13, the pressurizing surfaces on the upper and lower sides are provided with the metal press plate 65 through the buffer material 64 having hardness and thickness as described above. Therefore, although the elastic force of the pressurizing surface of the first press device 12 is not as large as that of the elastic body sheet 43, the difference between the actual plate thickness of the laminate molded article P and the detection value by the position sensor becomes more approximate. However, since the metal press plate 65 is not a complete rigid body, only a portion proximate to the convex portion of the substrate is suppressed from being extremely strongly pressed, the substrate and the laminated film are adhered to each other in such a manner that the laminated film is embedded in the concave portion of the substrate, and the laminate molded article P (secondary laminate molded article) is pressure-molded.

When the set pressurization time is completed (S4=Y), the pressurizing force control is terminated, and the step-down is started. When the pressurization is terminated and the pressurizing force becomes 0, as shown in FIG. 3, this point of time is the molded article releasing point, which is also the thickness of the final molded article plate thickness. Then, the servomotor 16 is driven in the reverse direction to lower the lower board 54 and the pressurizing block 60, and the laminate molded articles P (secondary laminate molded articles) abutted through the carrier films F1 and F2 are released from the pressurizing surfaces of the pressurizing blocks 60 and 61.

In the present embodiment, only the force control is performed in the second press process of the second press device 13, but at least the force control may be performed. That is, position control (including speed control) may be used in combination from the beginning, after elapse of a predetermined time, or after reaching a predetermined position. Only position control (including speed control) may be performed after a lapse of a predetermined time or after reaching a predetermined position. When the driving means of the first press device 12 is a hydraulic cylinder, the force control portion is replaced with pressure control. In the first embodiment, when only force control (pressure control) is performed or when control including an element of force control (pressure control) is performed, the plate thickness of the laminate molded article P (secondary laminate molded article) in which pressure-molding is terminated is not completely controlled to be the same plate thickness. However, it is meaningful to gradually smooth the state of unevenness on the surface of the laminate molded article P toward the final laminate molded article P and to also control the plate thickness. Regarding the plate thickness of the laminate molded article P, it is important to adjust the plate thickness of the secondary laminate molded article so as to be approximate to the value as much as possible with respect to the allowable range of the final laminate molded article P in order to perform position control without pressing the laminate molded article P with an excessive pressure in the third press device 14.

In the present invention, at least at the time of termination of the pressure-molding of the second press device 13, the distance between the board surfaces of the upper board 52 and the lower board 54 (the thickness of the laminate molded article P (secondary laminate molded article)) is measured by the linear scale 62 which is a position sensor, and is stored as the reference position A in the storage device 106 of the control device 20 (S5). The reference position A can be compared with the position of the rotary encoder 55 of the servomotor 16 and select which value to set as the control value. The rotary encoder 55 of the servomotor 16 corresponds to a position sensor that measures a distance between the base board 51 and the lower board 54 of the present embodiment. When the servomotor 16 is attached to the upper board 52 and the ball screw nut 58 is attached to the lower board 54 that rises and lowers, the rotary encoder 55 of the servomotor 16 functions as a position sensor that measures the distance between the upper board 52 and the lower board 54. At this time, the distance between the board surfaces is usually measured at the termination of the pressure-molding, but in a case where the plate thickness is not pushed down by position control or the like for some percentage of the latter half, the distance between the board surfaces at the termination of the forward movement of pressurization at the time point when the plate thickness finally becomes no thinner, or the like, may be measured instead of the distance between the board surfaces at the termination of the pressure-molding (the plate thickness of the laminate molded article). When the distance between the board surfaces is measured, the measurement value is used as the reference position A to control the third press device 14, which is a press device in a post-process immediately after. More specifically, the position control value B of the press device 14 in the post-process is generated from the reference position A and stored (S6), and used for control. Note that the position control value B of the third press device 14 in the post-process may be generated before the start of the pressure-molding of the third press device 14. Therefore, the control of the third press device 14 is associated with each of the laminate molded articles P and is different every time.

Then, when the second press process by the second press device 13 is terminated after a predetermined time has elapsed and the laminate molded article P (secondary laminate molded article) is laminate molded, the servomotor 16 is driven and the lower board 54 is lowered to perform a die opening operation (S7). At this time, since the surface of the pressure-molded secondary laminate molded article is subjected to pressure-molding by the pressurizing blocks 60 and 61 in which the metal press plate 65 having elasticity is provided on the pressurizing surface of the second press device 13 through the buffer material 64, the unevenness remaining on the surface of the primary laminate molded article are processed to be even flatter in most cases. In many cases, the plate thickness of the thickest portion of the secondary laminate molded article is smaller than that of the primary laminate molded article.

Note that, as described above, the first press device 12 and the second press device 13 are often subjected to only the force control or a control in which the elements of force control occupy a majority, and thus, in particular, force detection units such as a load cell and a tie bar sensor are often essential.

Then, with the feeding of the carrier films F1 and F2 by the unwinding roll 21 and the driven roll 22, the unwinding roll 24 and the driven roll 25 of the carrier film feeding device 18 and the winding of the carrier films F1 and F2 by the winding rolls 91 and 93 of the winding device 19, the laminate molded article P (secondary laminate molded article) is conveyed between the upper board 72 and the lower board 74 of the third press device 14 in the post-process of the second press device 13, and is stopped at a predetermined pressurizing position.

Figure 4:
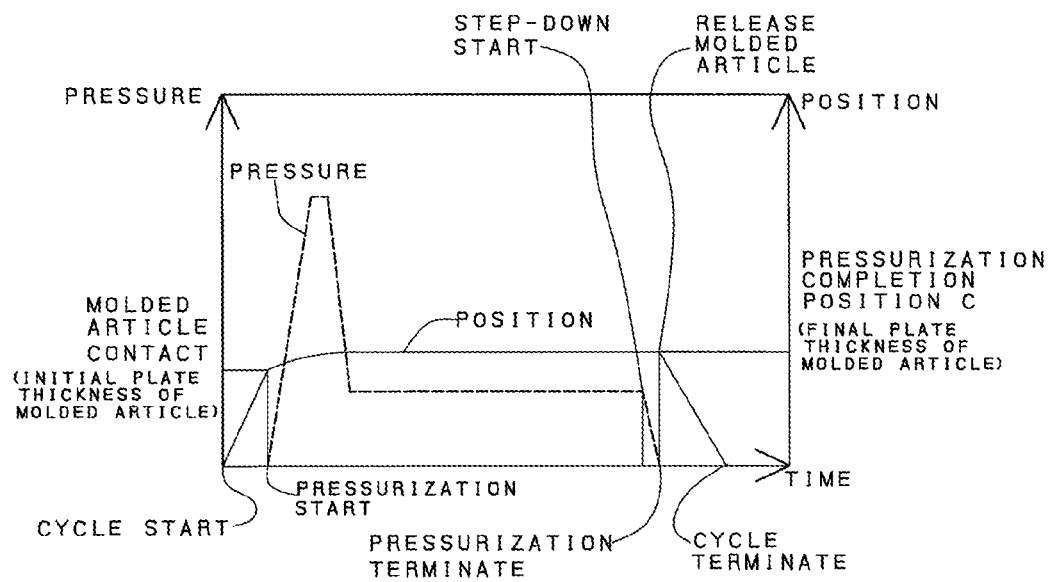
FIG. 4 is a graph showing a relationship between pressure and a position in a third press process by a third press device.
Figure 6:
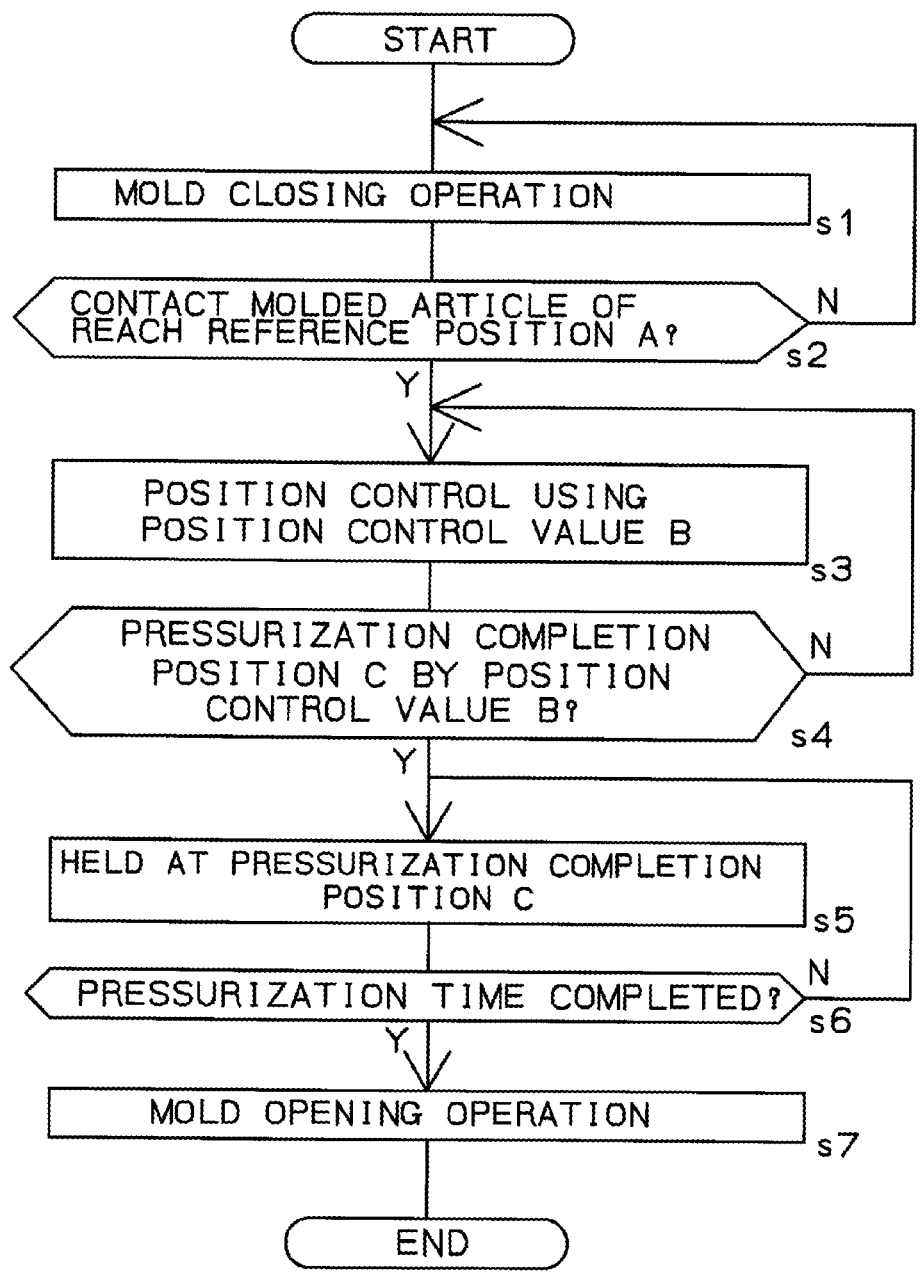
FIG. 6 is a flowchart illustrating control of a third press process by the third press device.

Next, the third press process by the third press device 14 will be described with reference to the graph of FIG. 4 and the flowchart of FIG. 6. The servomotor 17 of the third press device 14 is operated, the lower board 74 and the pressurizing block 80 are raised, and the mold closing operation of the third press process is started (s1). When the laminate molded article P on the pressurizing surface of the pressurizing block 80 attached to the lower board 74 and the pressurizing surface of the pressurizing block 80 attached to the upper board 72 come into contact with each other (s2=Y), pressurization is then started. At this time, if the second press device 13 and the third press device 14 have the same standard, the reference position A measured in the second press process of the pre-process may be set as the switching position to the start of pressurization. In the pressurization control of the third press process, closed-loop control using position control (including speed control) as illustrated in FIG. 4 is performed. That is, control using the reference position A detected in the second press process of the pre-process and stored in the storage device 106 is performed, and position control using the position control value B generated from the reference position A is performed (s3). This point will be described in more detail in relation to the block diagram of FIG. 2, where the value of the linear scale 62 is added to or subtracted with respect to the position command signal transmitted from the position command signal output unit 111 by the adder 114, and is transmitted to the servo amplifier 56 as a command signal by the command signal generation unit 115 through the force/position comparison switching unit 112. When not only the position control but also the force control is also used, the value of the load cell 39 is added to or subtracted with respect to the force command signal transmitted from the force command signal output unit 110 by the adder 113, the position command signal and the force command signal are added up by the force/position comparison switching unit 112, and a final command signal is generated by the command signal generation unit 115 and transmitted to the servo amplifier 56.

Furthermore, in relation to the actual laminate molded article P, in the third press process, control is performed by position control (or speed control) from the beginning. Then, stroke control (position control) is performed by a position control value B generated such that the plate thickness is reduced by a predetermined value from the plate thickness (reference position A) of the laminate molded article P measured by the press device 13 in the pre-process. In other words, the closed-loop control is performed based on a command to move the lower board 54 from a certain position before the start of forward movement to a certain position after the completion of forward movement by a predetermined stroke. The control may be performed such that the plate thickness is always reduced by the same stroke among a large number of laminate molded articles P (secondary laminate molded articles) fed at this time, or the stroke may be increased when the plate thickness is relatively large and the stroke may be decreased when the plate thickness is relatively small according to the variation in the measured plate thickness of the laminate molded articles P (secondary laminate molded articles), so that the plate thickness difference of the laminate molded articles P (final laminate molded articles) is eliminated or is within the range of acceptable products. In this case, it can also be referred to as position control in which the final target position is defined to a specific value by calculation. When reaching the pressurization completion position C (target position) in the set stroke (s4=Y), it is held at the pressurization completion position C (s5). Therefore, in most cases, the plate thickness of the final laminate molded article is smaller than the plate thickness (thickest portion) of the secondary laminate molded article. The pressure detected by the load cell 79 during this time is boosted in the stage of stroke control of moving to the pressurization completion position C (target position) at the initial stage as illustrated in FIG. 4, but after reaching the pressurization completion position C (target position), the pressure is dropped as the position is merely held.

In the laminate molding system 11, the first press device 12, the second press device 13, and the third press device 14 are simultaneously subjected to press molding, and the press time is set to be the same, and hence even if any of the press devices reaches a target position, the mold closing state is continued to hold the position. When the predetermined pressurization time is completed (s6=Y), the servomotor 16 is then driven in the reverse direction to lower the lower board 74 and the pressurizing block 80, and the laminate molded articles P (final laminate molded articles) abutted through the carrier films F1 and F2 are released from the pressurizing surfaces of the pressurizing blocks 80 and 81, and the mold opening operation is performed (s7).

In the above description, the reason why the plate thickness of the laminate molded article P (secondary laminate molded article) is measured at the termination of the pressure-molding or the termination of the pressurization forward movement of the second press device 13 in the pre-process, is as described in the section of "PROBLEMS TO BE SOLVED BY THE INVENTION", but even if the pressurizing process is started after the plate thickness of the laminate molded article P is accurately measured when the laminate molded article P and the pressurizing surface abut with each other by the third press device 14 in the post-process (at the start of pressurization), the lower board 74 rises at a constant speed and the surface of the laminate molded article P is also soft, so that the plate thickness of the laminate molded article P cannot be measured with high accuracy. Thus, it is necessary to measure an accurate plate thickness at the termination of the pressure-molding or the termination of the pressurizing forward movement of the second press device 13 in the pre-process.

Furthermore, in the present embodiment, only the position control (including the speed control) is performed in the third press process by the third press device 14, but at least the position control may be performed. That is, force control (including pressure control) may be used in combination from the beginning to the end, from the beginning until a predetermined time elapses, or from the beginning until a predetermined position is reached. In any case, in the final stage, the final plate thickness is adjusted such that only the position control or the element of the position control occupies a majority.

For the position control (speed control) of the second press device and the third press device, a torque limit for detecting a current value (torque) transmitted to the servomotor and preventing the current value (torque) from exceeding a predetermined value may be provided. The torque limit may be essential for the position control (speed control) of the third press device in particular. As a result, in the case of the position control, for example, when the torque of the servomotor becomes too large to reach the target position in a case where the stroke is large as described above, a limit can be set so that the occurrence of defects such as the molten resin of the laminated film flowing out toward the side due to too much pressure being applied to the laminate molded article can be suppressed. In addition, the position control may be a speed control in which a command to move forward to any point after several seconds is transmitted, but these are also included in the concept of the position control as described above. For example, in the example of FIG. 4, the stroke from the molded article contact to the pressurization completion position C may be performed by speed control, and after reaching the pressurization completion position C, it may be switched to position control to hold the pressurization completion position C.

The plate thickness of the laminate molded article P (final laminate molded article) at the termination of the third pressurization process by the third press device 14 is an accurate thickness as the press processes of three stages described above are performed, the plate thickness of the laminate molded article P is measured particularly at least at the termination of the pressure-molding by the second press device 13 in the pre-process, and the measurement value of the plate thickness of the laminate molded article P is used for stroke control by speed control of the third press device 14 in the post-process. Even when slight unevenness remains on the surface of the secondary laminate molded article, it can be pressure-molded to a flatter laminate molded article P (final laminate molded article). Then, by feeding the next carrier films F1 and F2 by the carrier film winding device 19, the laminate molded article P (final laminate molded article) is conveyed to the take-out stage 95 in the post-process of the third press device 14, and further fed toward the next process by a device (not illustrated).

Note that the press device provided in the laminate molding system 11 may be any device as long as at least two or more press devices are continuously provided, and the laminate molded article pressure-molded by the press device in the pre-process is further pressure-molded by the press device in the post-process. That is, the laminate molding system 11 may be configured only by the first press device 12 and the second press device 13, the plate thickness of the laminate molded article P may be measured at least at the termination of the pressure-molding by the first press device 12, and the measurement value of the plate thickness of the laminate molded article P may be used for controlling the second press device 13. Alternatively, a press device such as a fourth press device may be provided after the third press device 14, the plate thickness of the laminate molded article P may be measured at least at the termination of the pressure-molding of the press device in the pre-process, and the measurement value of the plate thickness of the laminate molded article P may be used for controlling the press device in the post-process.

As described above, in the second press device 13 and the third press device 14, the pressurizing surface is a metal press plate, and only the position control or the control including the element of a force control may be performed, and thus it is preferable to provide a position sensor for particularly performing position control in addition to the rotary encoders 55 and 75 of the servomotors 16 and 17.

Next, thermal expansion countermeasures in the laminate molding system 11 according to the present embodiment will be described. The first thermal expansion countermeasure is a thermal expansion countermeasure of the upper boards 32, 52, and 72, the lower boards 34, 54, and 74, the tie bars 33, 53, and 73, the pressurizing blocks 40, 41, 60, 61, and 80, 81, the ball screws 37, 57, and 77, and the like of the first press device 12, the second press device 13, and the third press device 14. In the laminate molding system 11, as described above, the origin of the scale 62 and the like is set before laminate molding, and control is performed using a value from the origin. However, when the number of molding is increased in the laminate molding system 11, the heat of the pressurizing blocks 40, 41, 60, 61, 80, and 81 is transferred to the upper boards 32, 52, and 72, the lower boards 34, 54, and 74, and the tie bars 33, 53, and 73, or the temperature of the ball screws 37, 57, and 77 is raised by frictional heat, and thermal expansion occurs. For example, when the distances between the board surfaces of the upper boards 32, 52, and 72 and the board surfaces of the lower boards 34, 54, and 74 are measured by the linear scales 42, 62, and 82, the thermal expansion of the pressurizing blocks 40, 41, 60, 61, 80, and 81 and the thermal expansion of some portions of the upper boards 32, 52, and 72 and some portions of the lower boards 34, 54, and 74 are not reflected in the measurement by the linear scales 42, 62, and 82.

Therefore, when these members are thermally expanded, the actual interval between the pressurizing surfaces (plate thickness of the laminate molded article P) may be smaller than the detection value (value from the control origin) of the linear scales 42, 62, and 82. Therefore, in the present embodiment, the control value is corrected in correspondence with the thermal expansion of the press device in view of elements such as the actual measurement value of the temperature of each part and the number of molding with respect to the detection value. The thermal expansion is corrected in the thermal expansion correction unit 109 of the first press device control unit 102, the second press device control unit 103, and the third press device control unit 104 of the control device 20.

Specifically, it is desirable to correct the value of the command value without correcting the origin position. For example, in a case where the scale 62 or the like is used in which the position detection value increases as a positive value toward the mold opening direction with the control origin set to 0, when the position control is performed at the time of pressurization, the value of the command value such as the stop position of the position control is largely changed. Then, the stop position is retracted by the amount of thermal expansion of the pressurizing blocks 60 and 61, or the like. When stroke control is performed from the abutment position with the laminate molded article A, the command value of the stroke is reduced. It is to be noted that the fact that the abutment position at the time of mold closing cannot be accurately detected is as described in the above section "Problems to be Solved by the Invention". Therefore, it can be said that it is difficult to correct the abutment position of the laminate molded article A and the pressurizing block 60 or the like as the origin position at the time of actual molding. In the present invention, in particular, the third press device 14 performs only the position control or the control in which the elements of the position control are more than half, and thus it is desirable that at least the control of the third press device 14 in the post-process is to correct the control value in correspondence with the thermal expansion of the press device 14. However, as a matter of course, the first press device 12 and the second press device 13 may also correct the control value at the time of pressurization in correspondence with thermal expansion.

In addition, the timing of thermal expansion correction in the laminate molding system 11 may be performed when each of the press devices 12, 13, and 14 reaches a predetermined molding number defined in advance. In this case, in the laminate molding system 11, when thermal expansion correction is simultaneously performed in all the press devices 12, 13, and 14, in the sequentially fed laminate molded article A, as an example, a laminate molded article A in which the primary molding is performed before the thermal expansion correction, but the secondary molding and the tertiary molding are performed after the thermal expansion correction is generated. Therefore, it is also preferable to shift the timing of thermal expansion correction of the press devices 12, 13, and 14 so that molding is unified such as molding before thermal expansion correction is performed in all the press devices 12, 13, and 14 or molding after thermal expansion correction is performed in all the press devices 12, 13, and 14 for each laminate molded article A. That is, thermal expansion correction is performed only in the first press device 12 after the $N^{th}$ laminate molding, thermal expansion correction is performed only in the second press device 13 after the $N+1^{th}$ laminate molding, and thermal expansion correction is performed only in the third press device 14 after the $N+2^{th}$ laminate molding. Furthermore, as a timing of thermal expansion correction in another laminate molding system 11, thermal expansion correction may be performed at a time point when the temperature of the press devices 12, 13, and 14 is detected and reaches a predetermined temperature. That is, a temperature sensor may be provided on the upper board, the tie bar, the lower board, the ball screw or the like, which is the portion where temperature rises is delayed as compared with the pressurizing block or the like, and the thermal expansion correction may be performed from the press devices 12, 13, and 14 in which the temperature sensor detects that the relevant portion has reached a predetermined temperature.

The second thermal expansion countermeasure relates to a thermal expansion countermeasure for the laminate molded article P pressure-molded by the first press device 12, the second press device 13, and the third press device 14. When the side surface of the laminate molded article P is opened at the time of the pressure-molding of the laminate molded article P by the first press device 12, the second press device 13, and the third press device 14, the laminate molded article P is likely to expand in the side surface direction and a molded article having a thick central portion tends to be obtained. Therefore, the laminate molded article P is conveyed in a framework having a frame shape, and pressure-molding is performed by the first press device 12, the second press device 13, and the third press device 14 in a state where the inner surface of the frame shaped framework and the side surface of the laminate molded article P are abutted with each other. Alternatively, it is possible to perform thermal expansion countermeasures of the laminate molded article P by taking measures such as pressurizing from each side surface of the laminate molded article P by the pressurizing member at the time of the pressure-molding. This also has an effect of preventing the resin film in a molten state from flowing out to the side when excessive pressurizing pressure is applied to the laminate molded article P.

Next, a method for controlling the laminate molding system performed using a laminate molding system 11 according to another embodiment will be described. In the above embodiment, a control method has been mainly described in which the plate thickness of the laminate molded article P is measured at least at the termination of the pressure-molding by the press device 13 in the pre-process, and the measurement value of the plate thickness of the laminate molded article P is used for controlling the press device 14 in the post-process. However, for the laminate molding system 11 of another embodiment, the detection values of the respective press devices 12, 13, and 14 are feedback-controlled and used only in the relevant press devices 12, 13, and 14, and are not used in the press devices 13 and 14 in the post-process. However, in a plurality of molding cycles, arithmetic processing such as storing detection values individually detected by the respective press devices 12, 13, and 14 and taking an average value may be performed to correct the molding conditions at the time of pressurization of the respective press devices 12, 13, and 14 of the laminate molding system 11.

Next, a method for manufacturing the laminate molded article performed using the laminate molding system 11 of the present embodiment will be described. The laminate molded article P of the present embodiment is a laminate molded article P for a build-up substrate, and includes a circuit board having unevenness and an interlayer insulating film overlaid on both surfaces of the circuit board. Then, in the method for manufacturing the laminate molded article of the present embodiment, the pressurizing surface formed of the elastic body sheet 43 is pressed against the laminate molded article P by control involving force control using the servomotor 15 in the pressure reduced chamber VC of the first press device 12 to obtain a primary laminate molded article. Next, a pressurizing surface formed of the metal press plate 65 or a pressurizing surface formed of an elastic body sheet is pressed against the primary laminate molded article by control involving at least the force control using the servomotor 16 of the second press device 13 to obtain a secondary laminate molded article. Furthermore, the pressurizing surface formed of the metal press plate 85 is pressed against the secondary laminate molded article by control involving at least position control using the servomotor 17 of the third press device 14 to obtain a final laminate molded article.

Although the present invention is not listed one by one, the present invention is not limited to those of the first embodiment and the second embodiment described above, and it goes without saying that the present invention is also applied to those modified based on the gist of the present invention by those skilled in the art and those obtained by multiplying the respective descriptions of the first embodiment to the second embodiment. The laminate molded article laminate molded in the laminate molding system 11 may be another plate-shaped body such as a semiconductor wafer or a solar cell other than a circuit board such as a build-up substrate.

What is claimed is:

1. A laminate molding system in which at least three or more press devices are continuously provided and a laminate molded article is sequentially pressure-molded, the laminate molding system comprising:
   a first press device having a pressure reducible chamber and a pressurizing surface formed of an elastic body sheet, the laminate molded article being pressurized by a first driving force of a first servomotor;
   a second press device having a pressurizing surface formed of a metal press plate or a pressurizing surface formed of an elastic body sheet, the laminate molded article being pressurized by a second driving force of a second servomotor;
   a third press device having a pressurizing surface formed of a metal press plate, the laminate molded article being pressurized by a third driving force of a third servomotor, which are continuously provided; and
   a control device for controlling operation of the laminate molding system,
   wherein the control device is configured to measure, using a second position sensor provided in the second press device, a distance between board surfaces of an upper board of the second press device and a lower board of the second press device to obtain a board distance value after pressurization in the second press device, and further configured to perform position control of the third press device based on the board distance value,
   wherein the board distance value provided in the second press device is stored as a reference position A in a storage device of the control device, and position control of the third press device is performed based on a position control value B,
   wherein the position control value B is generated in the control device based on the reference position A.

2. The laminate molding system according to claim 1, wherein at least the first press device and the second press device each include a force detection unit for performing force control.

3. The laminate molding system according to claim 1,
   wherein the third press device includes a third position sensor, and
   wherein the second position sensor and the third position sensor are configured to perform position control separately from rotary encoders attached to the second servomotor and the third servomotor respectively associated with the second press device and the third press device.

4. The laminate molding system according to claim 1, wherein each of the first press device, the second press device, and the third press device includes a plurality of servomotors.

5. The laminate molding system according to claim 2,
   wherein the third press device includes a third position sensor, and
   wherein the second position sensor and the third position sensor are configured to perform position control separately from rotary encoders attached to the second servomotor and the third servomotor respectively associated with the second press device and the third press device.

6. The laminate molding system according to claim 2, wherein each of the first press device, the second press device, and the third press device includes a plurality of servomotors.

7. The laminate molding system according to claim 1,
   wherein the position control value B is generated in the control device based on the reference position A in that the position control value B is reduced by a predetermined value from reference position A.

* * * * *